United States Patent [19]

Kanzaki et al.

[11] Patent Number: 4,594,733

[45] Date of Patent: Jun. 10, 1986

[54] SIGNAL PROCESSING SYSTEM AND THE METHOD

[75] Inventors: Minoru Kanzaki; Kazumi Komiya, both of Yokosuka; Masaharu Tadauchi; Kunio Sato, both of Hitachi; Kiyohiko Tanno, Katsuta, all of Japan

[73] Assignee: Nippon Telegraph & Telephone Hitachi Ltd & Public Corporation, Tokyo, Japan

[21] Appl. No.: 424,368

[22] Filed: Sep. 27, 1982

[30] Foreign Application Priority Data

Apr. 2, 1982 [JP] Japan ................................ 57-53807

[51] Int. Cl.[4] .............................................. G06H 9/38
[52] U.S. Cl. ................................ 382/50; 340/347 AD; 358/282
[58] Field of Search ..................... 382/53, 50; 358/282; 340/347 AD

[56] References Cited

U.S. PATENT DOCUMENTS

| 3,267,293 | 8/1966 | Hinds | 382/50 |
| 3,599,148 | 8/1969 | Stern | 382/53 |
| 4,367,457 | 1/1983 | Tadauchi et al. | 358/282 |
| 4,420,742 | 12/1983 | Tadauchi et al. | 382/50 |

Primary Examiner—Leo H. Boudreau
Assistant Examiner—Joseph Mancuso
Attorney, Agent, or Firm—Antonelli, Terry & Wands

[57] ABSTRACT

A/D conversion of a video scan signal having a substantially constant shading profile. Waveform of a blank or white scan signal is decomposed into gently varying component and steeply changing component superposed on the former. These components are detected by separately provided A/D converters. The gently varying component can be detected by a low speed A/D converter. By adopting the level of the gently varying component as a reference level, the steeply changing components can be detected with a reduced number of bits at an improved precision.

15 Claims, 8 Drawing Figures

SIGNAL PROCESSING SYSTEM AND THE METHOD

CROSS REFERENCE TO RELATED APPLICATIONS

This application relates to subject matter described in Japanese Patent Application No. 54-63842 filed on May 25, 1979 by Hitachi Ltd., and invented by Masaharu Tadauchi (corresponding to U.S. patent application Ser. No. 151,982 filed on May 21, 1980, now abandoned) and Japanese Patent Application Nos. 55-60565 and 55-60566 both filed on May 9, 1980 by Hitachi Ltd. and Nippon Telegraph and Telephone Public Corporation and invented by Masaharu Tadauchi, Kiyohiko Tanno and Taizoh Nakano (corresponding to U.S. patent application Ser. No. 260,090, now U.S. Pat. No. 4,420,742).

BACKGROUND OF THE INVENTION

1. FIELD OF THE INVENTION

The present invention relates to scan signal processing, and more particularly to a system and a method of converting an analog scan signal having a substantially common shading profile to a digital signal.

2. DESCRIPTION OF THE PRIOR ART

When an analog signal is converted to a digital signal such as bi-level or tri-level signal, the analog signal voltage is compared with a reference voltage or reference voltages to produce the digital signal. The conversion precision depends on the precisions of the analog voltage and the reference voltage.

In a facsimile or an optical character reader (OCR), optical information, such as characters on a document sheet, is scanned by photo-electric converter means, such as a CCD line sensor or a proximity line sensor, to produce an analog video signal, which is then converted to a digital video signal. The analog video signal may comprise a background component representing a plain paper component and the information component superposed on the background component. When the optical information representing the darkness and brightness on the document sheet is converted to a bi-level video signal, the conversion precision depends on the background component, e.g. the distribution of illumination on the document sheet, image focusing conditions of an optical system including lenses and distribution of sensitivity of individual sensor elements in a line sensor. Thus, even if the object (document sheet) is plain (e.g. uniformly white), the scanned analog video signal (referred to as a blank or white scan signal) corresponding to the background component may not have a constant voltage level but may have a specific profile. This profile is reproduced in each scan with substantially the same pattern. Such a characteristic distribution of the analog video scan signal representing the background component (state of no information) is called shading. A general or relative characteristic distribution is called a shading profile, and a characteristic distribution including voltage level is called a shading characteristic, in this specification. When the analog information signal containing shading is compared with a constant reference voltage to convert it to a digital signal, a correct digital information signal is not produced.

Heretofore, optical compensation and electric compensation for shading have been proposed. In the optical compensation, the illumination of the document sheet may be adjusted by regulating or adjusting a light source or disposing a filter or a mask so that a white scan signal having a constant signal level may be produced. This method needs a complex and large device and takes a long time for adjustment and yet is hard to attain a sufficient effect particularly for compensation of nonuniformity in sensitivity among picture elements in a line sensor.

The electrical compensation includes controlling the gain of a video amplifier to produce a shading-free video signal and effecting compensation in the signal processing for converting an analog signal containing shading to a digital signal.

It has been proposed, as a form of electric compensation, to store the shading in a memory and read it out in a scan cycle to modify the reference or slice signal to compensate the shaded signal.

Co-pending U.S. patent application Ser. No. 151,982 teaches to carry out shading compensation using a stored shading profile and a peak voltage of the scan signal held in a peak-hold circuit.

Co-pending U.S. patent application Ser. No. 260,090 further proposes normalization of the shading characteristic by the peak value thereof and denormalization of the stored shading profile by an instantaneous peak value, so as to improve the conversion accuracy.

These techniques are, however, not fitted for compensating rapid or steep changes in the shading profile with a simple circuit configuration of a small memory capacity.

SUMMARY OF THE INVENTION

It is an object of the present invention to provide a signal processing system with a simple converter structure and a small memory capacity, which can correctly convert an information-bearing analog scan signal containing a rapidly-changing shading profile to a digital signal.

It is also an object of the present invention to provide a signal processing method which is capable of compensating for a rapidly or steeply changing shading profile with a simple converter structure and a reduced memory capacity.

The inventors have found that rapid or steep changes in the shading characteristics provided by a blank scanning are mainly due to sensitivity variations of the picture or sensor elements in a line sensor and partly to the conditions of optical system and further that they have magnitudes within a limited range when measured from the level of the gradually changing characteristic.

According to an aspect of the present invention, a limited voltage range is set based on the gradually changing component and a real analog signal is digitized in this limited voltage range at a high fidelity. This reduces the required memory capacity and the required number of comparators for attaining a desired accuracy.

Other objects, features and advantages of the present invention will become apparent in the following detailed description on the preferred embodiments referring to the accompanying drawings.

DESCRIPTION OF THE PREFERRED EMBODIMENTS

For having a better understanding of the present invention, description will first be made on a typical example of the prior art signal processing system.

Figure 1:
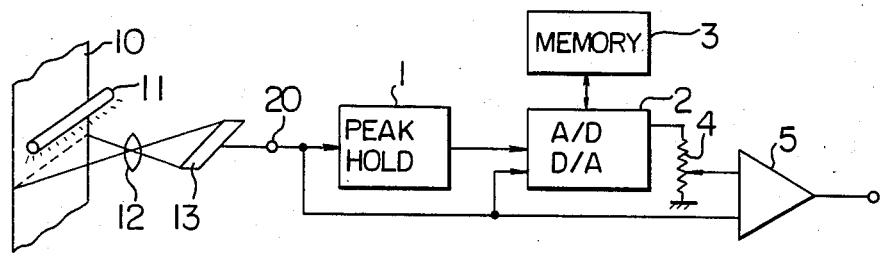
FIG. 1 is a block diagram of a conventional signal processing system.

FIG. 1 shows a block diagram illustrating a conventional signal processing system in which an analog video signal as detected is converted into a digital video signal, after having been correctively compensated with respect to waveform distortions. Image information of a document 10 illuminated with a light source 11 which may be constituted by a fluorescent lamp is picked up by an optical system 12 and projected onto a line sensor 13 in the focused state. The analog video scan signal thus produced by the line sensor 13 is applied to an input terminal 20 to which a peak hold circuit 1 is connected. The latter is adapted to detect the peak value or level of the analog video scan signal inputted to the terminal 20 and to hold the detected peak value. A converter circuit 2 which serves for both functions of an analog-to-digital or A/D converter and a digital-to-analog or D/A converter is supplied with the peak level signal from the output of the peak hold circuit 1. When a white scan signal component which corresponds to the background component and carrying no image information is inputted, the circuit 2, functioning then as an A/D converter, normalizes the white scan signal level with the peak value thereof being currently held by the circuit 1, and the resulting digital data is stored in a memory 3. In this manner, the shading profile mentioned hereinbefore is stored. Subsequently, an analog video signal carrying image information is inputted to the peak hold circuit 1 which then detects and holds the instantaneous peak value. The converter circuit 2 which functions as the D/A converter at this time denormalizes with the currently held instantaneous peak value the shading profile read out from the memory 3 to thereby produce a pseudo-analog white scan signal. On the basis of the level of the (pseudo-analog) white scan signal thus obtained, a slice signal is formed by means of a voltage dividing resistor 4. The input analog video signal is digitized by a comparator 5 with reference to the slice signal. In this way, there is obtained a digital video signal in which waveform distortions have been compensated. The signal processing system described above however suffers difficulties mentioned below.

For example, when remarkable non-uniformity in sensitivity exists among the individual sensor or picture elements of the line sensor, there will appear an analog video signal which exhibits positive or negative spikes or steep changes in the signal amplitude for singular sensor elements, even if the document data or information read by the line sensor is of uniform density. For correcting or compensating such steep changes in sensitivity among the individual sensor or picture elements, the A/D and D/A converter circuit 2 has to be constituted by a high speed converter circuit such as a parallel type A/D converter circuit. In particular, when the line sensor is to be operated at a speed which corresponds, for example, to 1 μs (micro second) for the single sensor element in the A/D conversion mode, as is common in the high speed facsimile systems, the A/D conversion must be effected within 1 μs with a resolution of about 7 bits. The parallel type A/D converter circuit operative at the rate of 7 bits as mentioned above requires as large a number as 128 comparators for implementation thereof, involving extremely high cost. Further, in order to correctively compensate the change in sensitivity for every sensor element with an acceptable precision, the capacity of the memory 3 is inevitably increased correspondingly. For example, when the output of a line sensor consisting of 2048 sensor elements is to be corrected at a precision corresponding to the resolving power of 7 bits, the capacity of the associated memory will then amount to 2048×7 bits.

It is accordingly an aim of the present invention to reduce the drawbacks of the prior art image signal processing system described above.

Now, the invention will be described in conjunction with exemplary embodiments thereof.

Figure 2A:
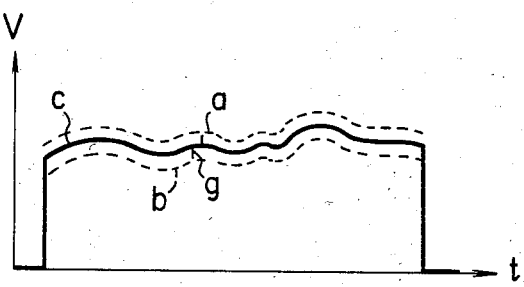
FIGS. 2A and 2B are schematic charts for explaining shading characteristics.
Figure 2B:
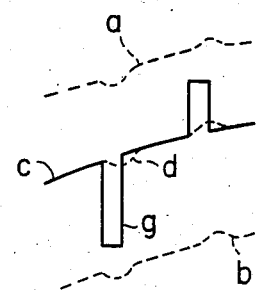
Figure 3:
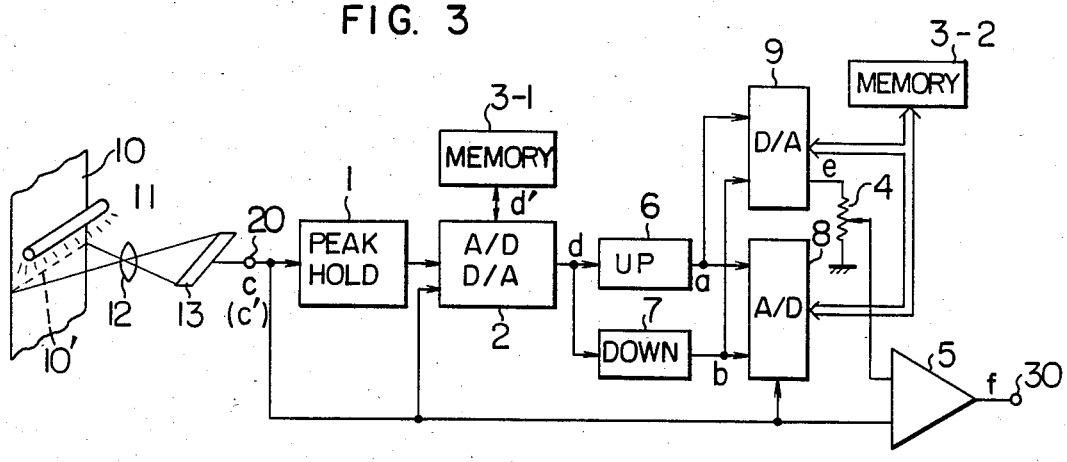
FIG. 3 is a block diagram of a signal processing system according to an embodiment of the invention.

FIGS. 2A and 2B are waveform diagrams for illustrating the principle of the present invention, and FIG. 3 shows schematically in a block diagram a facsimile system according to an embodiment of the invention.

Referring to FIG. 3, an image of a single scan line 10' of an object 10 such a document sheet or the like illuminated with a light source 11 such as a fluorescent lamp or the like is focused onto a line sensor 13 which may be constituted by, for example, 2048 sensor or picture elements (also referred to as pixels) and which supplies an analog video scan signal to an input terminal 20. Since the shading characteristic of the analog video scan signal defined hereinbefore corresponds to nothing but the signal waveform of the scan signal produced by the line sensor upon scanning of a document containing no information (i.e. background scanning), the shading characteristic is represented by the analog video scan signal produced from the output of the line sensor when the latter scans a white blank object 10, e.g. a white support plate for a sheet of document. In this case, a white scan signal indicated by a curve c in FIG. 2A and representative of the shading characteristic is repeatedly applied to the input terminal 20. Although the shading characteristic curve c varies gently as a whole, it exhibits locally steep changes g. In FIG. 2B there is illustrated in an exaggerated manner that portion of the curve c which contains the steep changes g. The steep change may occur over a single pixel or over several pixels. However, the change g is limited in magnitude. More specifically, referring to FIG. 2B, when the gentle variation is approximated by a curve d as a whole, and when upper and lower limits a and b of a relatively variable voltage range within which the steep changes may be confined are set by limit levels $a=(1+\alpha)d$ and $b=(1-\beta)d$, respectively, where $0<\alpha(\beta)<1$, it will be seen that magnitude of the steep change g falls substantially within the voltage range (a, b) which is determined on the basis of the value of d and can have a voltage span far smaller than the value d. Usually, the width $(a-b)=(\alpha+\beta)d$ is selected at most equal to d/2 and preferably at most equal to d/4. Accordingly, the shading characteristic c can be detected with a high accuracy and a small number of bits by fast-examining only the relatively variable voltage range (a, b). In this connection, it will be appreciated that the gentle change d can be detected by means of a low speed A/D converter, while the steep change g may be detected by a high speed A/D converter with an improved accuracy without requiring a lot of bits, because the voltage range (a, b) including the steep changes g is of a relatively short width or span.

For example, assuming that the whole voltage range is detected with 128 gradations, it may be sufficient for the high speed A/D converter to perform the detection with 8 to 32 gradations, i.e. $(\alpha+\beta)$ being 1/16 to ¼. For example, the number of gradations is 16, when $\alpha+\beta=\frac{1}{8}$. By the way, it is contemplated with the terms "low speed" and "high speed" that the detectable rate of change of the signal voltage v as a function of time, i.e. dv/dt is small and large, respectively. In other words, the high speed converter follows a higher rate of signal change than the low speed converter.

The facsimile system illustrated in FIG. 3 further includes a peak hold circuit 1 for detecting the peak value of the input scan signal and for holding the detected peak value, a converter (A/D and D/A) circuit 2 for detecting the gentle change or variation d of the white scan signal c and delivering a digital value d' resulted from normalization of the gently changing profile d by the peak value thereof, a memory 3-1 for storing the gently varying shading profile d' detected by the converter circuit 2, a step-up circuit 6 and a step-down circuit 7 for producing, respectively, the upper limit voltage a and the lower limit voltage b defined above on the basis of the voltage d supplied from the converter 2, a high speed A/D converter 8 and a high speed D/A converter 9 both capable of detecting and reproducing steep (high speed) changes within the relatively variable voltage range defined between the upper limit voltage level a and the lower limit voltage level b, a memory 3-2 for storing shading data detected in the voltage range mentioned above, a threshold circuit 4 for producing a slice level on the basis of the reproduced white scan signal level e, and a digitalizing or discriminating circuit 5 for digitalizing the analog scan signal c' based on comparison with the slice level. The digitalized signal output f from the circuit 5 is applied to an output terminal 30.

The A/D converter 2 is of a low speed type capable of detecting changes or variations in the shading characteristic curve c which are slower than the predetermined rate of voltage change dv/dt. For example, the A/D converter 2 for practical application may be constituted by a follow-up type A/D converter having a dynamic range of 7 bits (128 gradations) wherein the output detection value in a single sampling operation undergoes only a change not greater than one gradation relative to that of the preceding sampling. The converter circuit 2 serves to supply the analog detection voltage d to the voltage step-up circuit 6 and the step-down circuit 7 on one hand and on the other hand to supply to the memory 3-1 the digital value d' normalized with reference to the peak value as described hereinbefore. As a consequence, there is stored in the memory 3-1 the shading profile data d' in which the peak values of the waveform d are substantially eliminated. The peak hold circuit 1 may be realized in a configuration somewhat similar to that of the low speed A/D converter 2 to follow the gentle increasing. The peak hold 1 may be arranged to decrement a little at each end of the scan to follow a very gentle decrease of the peak value. The voltage step-up circuit 6 is adapted to amplify the analog voltage signal d supplied from the converter 2 to thereby produce the upper limit voltage a.

The voltage step-down circuit 7 is adapted to reduce the analog output voltage d supplied from the converter 2 to thereby produce the lower limit voltage b. The high speed A/D converter 8 which is capable of detecting a higher rate of voltage change dv/dt than the A/D converter 2 is adapted to digitize or digitalize the input analog video signal c within the relatively variable voltage range defined by the upper and lower limit voltages a and b. Data which results from digitalization by the high speed A/D converter 8 is supplied to the memory 3-2. Since the limit voltages a and b depend on the peak value, data stored in the memory 3-2 is also of the normalized shading profile. The low speed A/D converter 2 may be constituted by a device of the ramp type, a follow-up comparison type, a double integral type, a V-F (voltage-frequency) conversion type or the like, while the high speed A/D converter 8 may be of the sequential comparison type, the cascade comparison type, the parallel-serial type or the like. Data stored in the memory 3-2 corresponds to the steep change (g) superposed on the gentle change (d) whose data is stored in the memory 3-1. Accordingly, the shading profile (c) can be reconstituted by adding together both data contained separately in the memories 3-1 and 3-2. The threshold circuit 4 may be constituted by a voltage dividing resistor circuit so as to produce one or more threshold values (slice levels). The digitalizing circuit 5 may be composed of the same number of comparators as that of the threshold values.

Now, description will be made concerning the operations of the memories 3-1 and 3-2 for storing the white scan signal. In the first place, the analog white scan signal c corresponding to the single scan line is inputted, whereby the peak value of the white scan signal c is detected by the peak hold circuit 1. Next, the analog white scan signal c corresponding to the succeeding scan line is inputted, and the relative value d' of the white scan signal c with reference to the peak value, which serves as the reference or normalizing factor, is detected by the A/D converter circuit 2 as a digital signal and is supplied to the memory 3-1. The A/D converter 2 also supplies an analog output d. Since the A/D converter circuit 2 can not follow the steep or rapid changes g in the white scan signal c illustrated in FIG. 2B, the analog output signal produced by the A/D converter circuit 2 represents the analog scan signal d which varies gently and in which the steep change g is neglected. This signal d is amplified by the voltage step-up circuit 6 on one hand and attenuated or reduced by the step-down circuit 7 on the other hand to thereby produce the upper limit voltage waveform a and the lower limit voltage waveform b, respectively (refer to FIGS. 2A and 2B). The white analog scan signal c is converted into a corresponding digital signal by the A/D converter circuit 8 with the voltages a and b being utilized as the upper and the lower limit levels, respectively. The digital signal thus obtained is stored in the memory 3-2. Although the A/D converter circuit 8 is required to operate at a high speed, the A/D converter 8 of a reduced bit capacity can nevertheless assure a satisfactory accuracy by virtue of the narrow range defined between the upper limit a and the lower limit b.

The writing of data in the memories 3-1 and 3-2 may be effected concurrently (during the same scanning period) or alternatively data is written in the memory 3-1 upon one scanning operation and then written in the memory 3-2 in another succeeding scanning operation. In case differential approximation (Δ-approximation) is adopted, the last mentioned writing process, i.e. first in the memory 3-1 and subsequently in the memory 3-2 is preferred because higher accuracy or precision can be assured.

Next, it is assumed that the analog video signal c' carrying information to be transmitted is aplied to the input terminal 20. Also, the peak hold circuit 1 holds and produces at the output thereof an instantaneous peak value (level) obtained from the analog video signal up to the preceding line scanning. The signals or digital values read out from the memories 3-1 and 3-2 for every picture element in synchronism with the analog video signal input is subjected to D/A conversion through the D/A converter circuits 2 and 9 with the peak value being utilized as the reference value for denormalization (denormalizing factor), as a result of which a pseudo white analog scan signal e (where e=kc, k being a factor representative of the change of the peak value) which has been corrected in respect of the voltage level based on the peak value can be obtained at the output of the D/A converter circuit 9. The slice signal is derived from the white analog scan signal e by means of the voltage divider resistor 4 and applied to one input of the comparator 5 which has the other input supplied with the data carrying analog video signal c'. Thus, there is obtained at the output terminal of the comparator 5 a white and black binary digital video signal f which is substantially free of distortion.

Figure 4:
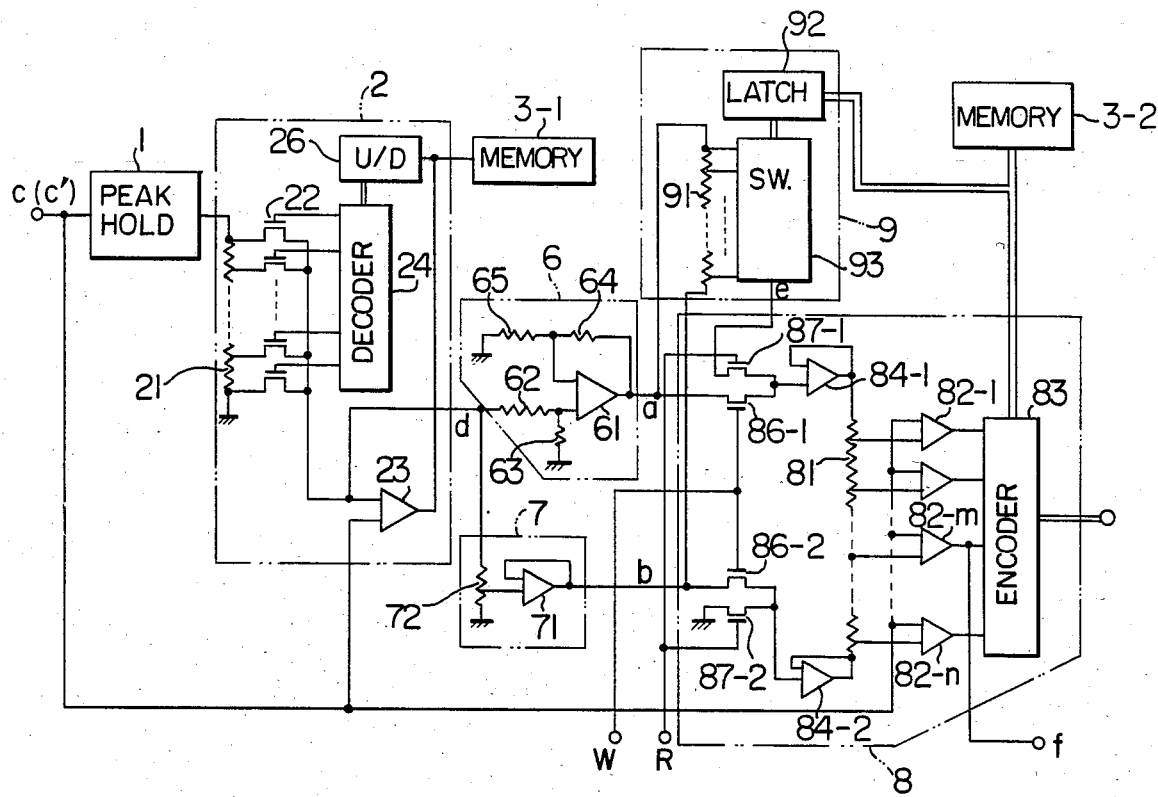
FIG. 4 is a block diagram of another signal processing system according to another embodiment of the invention.

FIG. 4 shows part of a more concrete signal processing system according to another embodiment of the invention. In this figure, parts corresponding to those shown in FIG. 3 are identified by similar reference symbols. A follow-up comparison type A/D and D/A converter circuit 2 comprises a voltage dividing resistor 21 connected between the output of the peak hold circuit 1 and the ground, semiconductor gate switches 22 connected between respective dividing tap terminals of the voltage division resistor 21 and the reference input terminal of a comparator 23, an up/down counter circuit 26 for setting a digital detection level in dependence on the output of the comparator 23, and a decoder 24 adapted to produce a gating signal for turning on an appropriate one of the gate switches 22 in dependence on the output of the up/down counter circuit 26. The divided voltage level selected by the decoder 24 (i.e. the output voltage of the preceding sampling) is compared with the input voltage c through the comparator 23 which produces at the output an output "1" or "0" in dependence on whether or not the input voltage c exceeds the divided voltage. If the comparator 23 generates "1", the counter 26 increments its content by one and the decoder 24 selects a switch 22 higher by one division. Thus, the reference voltage for the next sampling is incremented. Accordingly, the output voltage level of the converter circuit 2 is shifted by one for a single comparison operation, whereby the gentle waveform d is detected and supplied to input terminals of the voltage step-up circuit 6 and voltage step-down circuit 7. The memory 3-1 stores therein shading data bits, one bit per one picture element, wherein the maximum digital value is allocated to the peak voltage. Accordingly, data or information stored in the memory 3-1 concerns only the shading profile which represents the relative values of the waveform d. When the peak voltage has undergone change from the write-in operation until the read-out operation, such a shading characteristic will be reproduced that the changed peak voltage corresponds to the maximum digital value. Since the A/D converter circuit 2 can detect no more than one bit change for a single picture element, the A/D converter 2 can not follow the steep change g shown in FIG. 2B.

The voltage step-up circuit 6 comprises an operational amplifier 61, input bias resistors 62 and 63, and feedback resistors 64 and 65, and serves for amplifying the input voltage d up to the upper limit voltage $a=(1+\alpha)d$ where $\alpha$ represents a positive constant. On the other hand, the step-down circuit 7 comprises an operational amplifier 71 and a voltage dividing resistor 72 which serves for reducing the input voltage d to thereby produce the lower limit voltage $b=(1-\beta)d$ where $0<\alpha(\beta)<1$, $(\alpha+\beta)<1$, and thus $a-b=(\alpha+\beta)d<d$. Preferably, $(\alpha+\beta)$ is selected in a range from 1/16 to 1/8 for a 128 gradation system. The operational amplifier 71 serves as a voltage follower circuit. The high speed A/D converter 8 is of a parallel comparison type and is composed of a voltage dividing resistor 81, n comparators 82-1, 82-2, ... and 82-n, an encoder having n inputs to which the output signals of the comparators are applied in parallel, operational amplifiers 84-1 and 84-2 connected to both ends of the voltage division resistor 81 and serving as a voltage follower, and MOS switches 86-1, 86-2, 87-1 and 87-2 for selecting the operation mode.

In the memory write-in operation mode, the MOS switches 86-1 and 86-2 are turned on in response to the signal applied to the write terminal W, as the result of which the upper limit voltage a and the lower limit voltage b are applied to both ends of the voltage division resistor 81 by way of the voltage followers 84-1 and 84-2, respectively. In this way, the voltage dividing resistor 81 divides by (n+1) the voltage range defined between the upper limit voltage a and the lower limit voltage b. The divided voltages tapped from the resistor 81 are compared with the analog white scan signal c through the comparators 82-1, ..., 82-n, respectively. The outputs of the comparators 82-1, ..., 82-n are converted into corresponding binary signals by the binary encoder circuit 10 to be stored in the memory 3-2.

In this connection, the upper limit voltage a and the lower limit voltage b are so selected as to cover the range in which the steep change of the analog white scan signal occurs. Accordingly, the span between the upper and the lower limit voltages a and b (i.e. the width of the relative voltage range) may be significantly reduced, which in turn means that the number of the voltage dividing terminals required for dividing the voltage range as well as the number of the associated comparators can be correspondingly decreased. For example, only 15 or less comparators will be sufficient for effecting the compensation of waveform distortion with a satisfactory precision for practical application.

The high speed D/A converter 9 is composed of a voltage divider 91, a latch circuit 92 for latching parallel outputs from the memory 3-2, and a switch circuit 93 for selecting one of the divided voltages in dependence on the parallel outputs from the latch circuit 92. The switch circuit 93 may be realised in a configuration similar to the combination of the decoder 24 and the MOS switch 22 which constitute the D/A converter 2. The output terminal of the switch circuit 93 is connected to one end of the voltage dividing resistor 81 through the MOS switch 87-1 of the A/D converter 8. In other words, the threshold circuit for producing the slice level and the comparator for digitalization (and the encoder) are constituted by parts of the A/D converter 8. Of course, the threshold circuit 4 and the comparator 5 may be provided separately, as is the case of the embodiment shown in FIG. 3.

Next, description will be made concerning the read-out operation mode in which the shading profile stored in the memory is read out for digitalizing the analog video signal c'. It should be recalled that the upper limit voltage a and the lower limit voltage b which have been corrected with reference to the changed peak voltage make appearance at the output terminals of the voltage step-up circuit 6 and the step-down circuit 7, when the data is read out from the memory 3-1. The MOS switches 87-1 and 87-2 are turned on in response to the signal applied to the read terminal R. The voltage dividing resistor 91 is applied with the upper and the lower limit voltages a and b at both ends. Data read out from the memory 3-2 is inputted to the siwitch circuit 93 by way of the latch circuit 92. The switch circuit 93 will then select one of the voltages appearing at tap terminals of the voltage dividing resistor 91. The selected tap voltage is applied to one end of the voltage dividing resistor 81 through the MOS switch 87-1. This voltage represents the profile of the white scan signal reproduced in conformity with the current peak value. The other end of the voltage dividing resistor 81 is coupled to the ground potential by way of the grounded MOS switch 87-2 and the voltage follower 84-2. With the circuit arrangement mentioned above, there are produced at the tap terminals of the voltage dividing resistor 81 the slice level signals derived from division of the white signal level e. These slice level signals are compared with the information carrying analog video signal c' through the comparators 82-1, 82-2, ..., 82-n, respectively, to thereby effect digitalization of the input analog video signal c'. The output signals may be obtained as the binary output signals from the binary encoder circuit 83 or alternatively the output signal from one comparator 82-m may be utilized as the binary (white and black) digital video output signal f.

The memories 3-1 and 3-2 may be constituted by a random access memory (RAM) or a nonvolatile memory.

Further, when the number of the comparators 82-1, ..., 82-n is selected equal to 15, by way of example, the output signal of the binary encoder circuit 83 is composed of 4 bits. In this case, the memory 3-2 employed for correcting the non-uniformity in sensitivity of 2048 picture elements of the line sensor may only have the storage capacity of 2048×4 bits.

On the exemplary assumption mentioned above, the storage capacity of the memory 3-1 may be 2048×1 bits. Accordingly, the total storage capacity of both memories amounts to no more than 2048×5 bits, which means that the memory capacity can be significantly reduced as compared with a signal processing system of the conventional type which will require a memory capacity as large as 2048×7 bits. Besides, the A/D and D/A converter circuit 2 may be realized inexpensively by using a simple converter such as the follow-up comparison type converter or the like.

It will be now appreciated from the foregoing description that the present invention has provided a signal processing system in which the capacity of the memory for storing the signal waveforms can be reduced and the steep changes in sensitivity among the picture elements of the line sensor can be correctively compensated with the simplified A/D converter arrangement.

Modifications of the circuit arrangement shown in FIG. 4 will be described below.

In the case of the circuit arrangement shown in FIG. 4, the upper limit voltage a produced by the voltage step-up circuit 6 and the lower limit voltage b produced by the voltage step-down circuit 7 are applied to the voltage divider resistor 81 at both ends thereof. However, the lower limit voltage b may also be derived from the upper limit voltage a. Examples of the circuit configurations suited to this end are shown in FIGS. 5A and 5B.

Figure 5A:
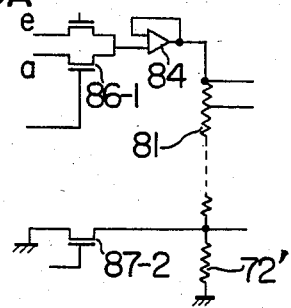
FIGS. 5A and 5B are partial circuit diagrams showing modifications of a part of FIG. 4.
Figure 5B:
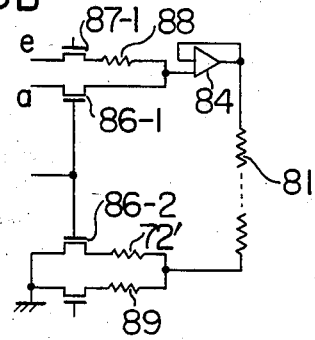

Referring to FIG. 5A, the upper limit voltage a produced by the step-up circuit 6 is applied to a series connection of resistors 81 and 72' through a voltage follower circuit 84. The other end of the resistor 72' is grounded. By selecting the resistance values of the resistors 81 and 72' so that the applied upper limit voltage is divided by a factor $(1-\beta)/(1+\alpha)$, a voltage given by a $(1-\beta)/(1+\alpha) = d(1-\beta) = b$ is produced at the interconnection between the resistors 81 and 72'. The resistor 81 is employed as the voltage dividing resistor and the respective tap terminals thereof are connected to the comparators 82-1, 82-2, ..., 82-n (FIG. 4). In this manner, the resistor 72' is used in place of the voltage step-down circuit 7. In the read-out mode of operation, the interconnection between the resistors 81 and 72' is grounded through a MOS switch 87-2.

The resistor 81 thus serves not only as the voltage dividing resistor of the high speed A/D converter 8 but also as the voltage dividing resistor of the threshold circuit 4 (FIG. 3) for producing the slice level signal. When the slice level is to be finely regulated, the voltage divider circuit may be realized in such a configuration as shown in FIG. 5B. More specifically, in the write operation mode, the applied upper limit voltage a is divided through cooperation of the resistors 81 and 72' in a similar manner as is in the case of the circuit shown in FIG. 5A. On the other hand, in the read-out operation mode, the reproduced white level signal e is divided through cooperation of the resistors 88, 81 and 89. In this case, the voltage dividing resistor 81 divides only a part of the applied voltage e to allow the selection of the slice level within the predetermined voltage range to be performed with higher precision.

The high speed A/D converter 8 shown in FIG. 4 is operative on the fully parallel comparison. Accordingly, for discriminating 16 gradiations (4 bits), the number of the comparators as required amounts to 15. The number of the comparators as required can be decreased by adopting a so-called 2-step parallel comparison principle, although components capable of operating at a higher speed must be used.

Figure 6:
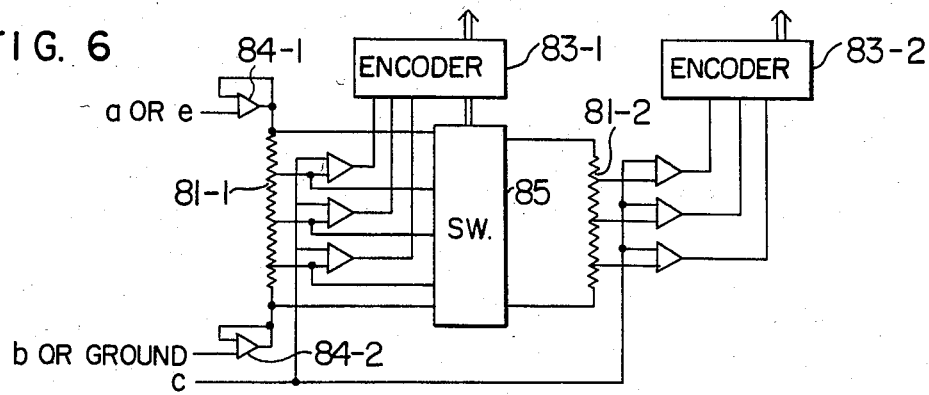
FIG. 6 is another partial circuit diagram showing an alternative A/D converter in the circuit of FIG. 4.

FIG. 6 shows an example of a 4-bit A/D converter of 2-step parallel comparison type to be used in the place of the high speed A/D converter 8. Referring to the figure, a coarse voltage division resistor 81-1 for establishing four coarse gradations or sections (corresponding to higher two bits) is provided to cooperate with an encoder 83-1 for detecting to which coarse gradation of the relatively variable voltage range the input signal belongs. The encoder 83-1 outputs two higher significant bit signals. At the same time, the switch circuit 85 is controlled to transmit the voltages appearing at adjacent tap terminals across the single division of the resistor 81-1 in concern to be applied to another voltage dividing resistor 81-2, which then operates to further effect fine division of the input video signal level into four gradations (corresponding to lower two bits). An encoder 83-2 outputs two less significant bits. Namely, the voltage divider 81-2 can divide any one of the four coarse divisions of the resistor 81-1 further into four fine divisions. Since the A/D conversion of two bits can be effected by three comparators, A/D conversion of four bits can be accomplished by six comparators by the 2-step parallel comparison. This circuit configuration requires the comparison operations for a single detecting operation. Accordingly, the comparators and other components should preferably be constituted by high speed elements such as ECL (emitter-coupled-logic) or the like.

We claim:

1. A signal processing system for digitizing analog scan signals obtained by line-by-line scanning of a document for information, said analog scan signals for each scan line having a shading of variable voltage level and substantially the same profile, comprising:

input terminal means for inputting an analog scan signal;

a first digital memory;

first means for detecting said analog scan signal for an information-blank scanning line, for analog-to-digital converting the detected analog scan signal and for storing said converted signal in said first digital memory in digital form, said detecting being responsive only to a rate of voltage change (dv/dt) of said analog signal which is no larger than a predetermined value, and including output means for supplying an analog output based on said stored digital signal by digital to analog conversion of said stored digital signal; and second means for generating signals identifying a voltage range having a range width smaller than the magnitude of said variable voltage level in response to the analog output of said first means, including means for generating a first voltage higher by a predetermined amount than the analog voltage outputted from said first means and means for generating a second voltage lower by a predetermined amount than the analog voltage outputted by said first means;

third means for detecting which of a plurality of voltage levels within the voltage range between said first and second voltages corresponds to an analog scan signal received at said input terminal means and for storing said detected voltage level in digital form;

fourth means for outputting an analog value within sid voltage range on the basis of the detected and stored digital voltage level and for producing at least a threshold level signal on the basis of said outputted analog value; and fifth mean for digitizing an analog scan signal applied to said input terminal means with reference to said threshold level signal.

2. A signal processing system according to claim 1, wherein said first means includes a peak hold circuit for detecting and holding a peak value of an analog scan signal, converter means for normalizing the level of an analog scan signal representing an information-blank scanning line received from said input terminal means with reference to said peak value and for outputting the normalized signal level in digital form to said first digital memory, and wherein said output means includes means denormalizing said normalized digital signal stored in said first digital memory with reference to said peak value and means for converting said denormalized digital signal to an analog output signal.

3. A signal processing system according to claim 2, wherein said third means includes an A/D converter which is operative in a memory write operation mode for digitally detecting an analog scan signal representing an information blank scanning line within said voltage range and a second digital memory for storing the digital value outputted from said A/D converter, wherein said fourth means includes a D/A converter which is operative in a memory read-out operation mode for converting the digital value read out from said second digital memory into an analog voltage within said voltage range and a threshold circuit for producing at least a threshold level signal on the basis of the voltage outputted from said D/A converter, and wherein said fifth means includes a discriminator for digitizing an analog scan signal with the aid of said threshold value.

4. A signal processing system according to claim 3, wherein said A/D converter includes a first voltage dividing resistor having a plurality of tap terminals for deriving divided voltages, at least two comparators connected to at least two of said tap terminals and an encoder coupled to the outputs of said at least two comparators, while said D/A converter includes a second voltage dividing resistor having a plurality of tap terminals for deriving divided voltages, and selector switch means for selectively outputting the voltage appearing at one of said tap terminals of said second voltage dividing resistor.

5. A signal processing system according to claim 4, wherein said threshold circuit includes said first voltage dividing resistor and a mode switch connected between said first voltage dividing resistor and said selector switch means.

6. A signal processing system according to claim 5, wherein said threshold circuit further includes a bias resistor connected in series with said first voltage dividing resistor.

7. A signal processing system according to claim 4, wherein said A/D converter further includes second selector switch means for selecting two adjacent tap terminals from said plural tap terminals of said first voltage dividing resistor for outputting the voltages appearing at said selected tap terminals, a fine voltage dividing resistor connected to said second selector switch means and having a plurality of tap terminals for deriving divided voltages from the output voltage of said second selector switch means, and at least two comparators connected to the tap terminals of said fine voltage dividing resistor.

8. A signal processing system according to claim 2, 3 or 4, wherein said converter means of said first means includes another voltage dividing resistor connected between the output of said peak hold circuit and ground potential and having a plurality of tap terminals for voltage division, a comparator, a plurality of switches connected between said plurality of tap terminals and one input of said comparator which has the other input connected to said input terminal means, and control means for selecting one of said plural switches in dependence on the output of said comparator.

9. A signal processing system for digitizing analog scan signals obtained by line-by-line scanning of a document for information said analog scan signals each having substantially the same shading profile, comprising:

(a) an input terminal for receiving said analog scan signals;

(b) a peak hold circuit connected to said input terminal for detecting and holding a peak voltage of said analog scan signals;

(c) a first means connected to said input terminal and said peak hold circuit for detecting, storing digitally and reproducing as an analog voltage gently changing voltage components of an analog scan signal representing an information-blank scanning line;

(d) voltage range setting means connected to said first means for setting a voltage range on the basis of said gently changing voltage components as detected, said voltage range having a width smaller than the magnitude of said detected voltage components, including means for generating a first voltage higher by a predetermined amount than the analog voltage outputted from said first means and mean for generating a second voltage lower by a predetermined amount than the analog voltage outputted by said first means;

(e) second means, connected to said input terminal and said voltage range setting means and capable of operating at a higher speed than said first means, for detecting, digitally storing and reproducing a voltage level within said set voltage range between said first and second voltage which corresponds to an analog scan signal received at said input terminal and representing an information-blank scanning line;

(f) threshold means for producing at least one threshold value signal on the basis on the voltage level produced by said second means; and (g) means for digitizing the input analog scan signal with reference to said threshold value.

10. A signal processing system according to claim 9, wherein said first and second means each include at least one comparator, and wherein said second means comprises a larger number of comparators than the number of comparators included in said first means.

11. A signal processing system according to claim 10, wherein said first means includes a single comparator, while said second means includes a plurality of comparators connected in parallel with one another.

12. A signal processing system for digitizing an analog video scan signal produced by a line sensor, comprising:

a first digital memory for storing a gently varying component of a shading profile of said analog video scan signal in digital form;

a second digital memory, for storing in digital form, components superposed on said gently varying component and including steeply changing components;

an input terminal for receiving the analog video scan signal produced by said line sensor;

a peak hold circuit for detecting and holding the peak value of said analog video scan signal;

means for producing said gently varying component as a first analog voltage in dependence on said peak value and the output of said first digital memory;

means for setting a voltage range on the basis of said first analog voltage, said voltage range having width smaller than the magnitude of said analog voltage, including means for generating a first voltage higher by a predetermined amount than said first analog voltage and means for generating a second voltage lower by a predetermined amount than said first analog voltage;

means connected to said voltage range setting means for producing a second analog voltage within said voltage range defined by said first and second voltages on the basis of the output of said second digital memory;

means for producing at least one threshold value on the basis of said second analog voltage; and means for digitizing the analog video scan signal fed from said input terminal through comparison with said at least one threshold value.

13. A signal processing system for recording the shading profile of an analog scan signal obtained by line-by-line scanning of a document for information, comprising:

(a) an input terminal for receiving said analog scan signal;

(b) a peak hold circuit connected to said input terminal for detecting and holding the peak voltage of said analog scan signal;

(c) first means connected to said input terminal and said peak hold circuit for detecting, sorting dititally and reproducing gently changing voltage components of an analog scan signal representing an information-blank scanning line;

(d) voltage range setting means connected to said first means for setting a voltage range on the basis of said gently changing voltage components as detected, said voltage range having width smaller than the magnitude of said detected voltage components, including means for generating a first voltage higher by a predetermined amount than the analog voltage ouputted from said first means and means for generating a second voltage lower by a predetermined amount than the analog voltage outputted by said first means; and (e) second means, connected to said input terminal and said voltage range setting means and capable of operating at a higher speed than said first means, for detecting and storing digitally a voltage level within said set voltage range corresponding to the analog scan signal representing a blank scanning line.

14. A method of digitizing analog scan signals each having shading of a variable level and substantially the same profile, comprising steps of:

(a) detecting a gently varying component of a reference analog scan signal, storing the detected component as a first digital value and supplying an analog value corresponding to said stored digital value;

(b) setting an upper limit voltage and a lower limit voltage of a voltage range by stepping up and stepping down, respectively, the voltage level of the gently varying component of said reference analog scan signal;

(c) detecting the voltage level of said reference analog scan signal within said voltage range defined between said upper and lower limit voltage and storing the detected level as a second digital value;

(d) deriving a first analog signal from the peak value of the analog video scan signal and said first digital value;

(e) setting upper and lower limits of a voltage range by stepping up and stepping down, respectively, said first analog signal;

(f) deriving a second analog signal from said upper and lower limit voltages and said second digital value; and (g) digitizing an analog video signal on the basis of said second analog signal.

15. A method according to claim 14, wherein said step (a) includes the sub-steps of detecting the peak value of said reference analog signal, detecting the instantaneous value of the gently varying component of said reference analog signal relative to said peak value and digitizing the detected instantaneous value, and supplying the analog voltage corresponding to said digitized value, and said step (c) including sub-steps of dividing the voltage range defined between said upper and lower limit voltages into a predetermined number of voltages and comparing said reference analog scan signal with each of said divided voltages.

* * * * *